(12) United States Patent
Lee

(10) Patent No.: US 7,026,213 B1
(45) Date of Patent: Apr. 11, 2006

(54) METHOD OF FABRICATING FLASH MEMORY DEVICE

(75) Inventor: Byoung Ki Lee, Icheon-si (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/166,484

(22) Filed: Jun. 24, 2005

(30) Foreign Application Priority Data

Apr. 22, 2005  (KR) .................... 10-2005-0033704

(51) Int. Cl.
*H01L 21/336* (2006.01)

(52) U.S. Cl. ...................... 438/257; 438/786

(58) Field of Classification Search ............... 438/201, 438/211, 257, 258, 259, 400, 786, FOR. 212
See application file for complete search history.

(56) References Cited

U.S. PATENT DOCUMENTS

| 6,924,196 B1* | 8/2005 | Sharma et al. ............... 438/257 |
| 2003/0139027 A1* | 7/2003 | Ikeda et al. .................. 438/592 |
| 2005/0202686 A1* | 9/2005 | Saki et al. .................... 438/783 |

* cited by examiner

*Primary Examiner*—Michelle Estrada
(74) *Attorney, Agent, or Firm*—Marshall, Gerstein & Borun LLP

(57) ABSTRACT

The present invention relates to a method of fabricating a flash memory device. According to the present invention, an oxide film is deposited and etched to form trenches, the trenches are filled with a metal film, and the metal film undergoes CMP to form bit lines. In this case, an etch stop layer of the trench etch process, a CMP stop layer of a CMP process and a wet barrier on the sides of the trenches are formed using a thermally treated SiON film having an etch rate lower than that of a wet chemical. As such, since a thickness and width of bit lines can be made uniform, bit line resistance and capacitance can be maintained constantly.

9 Claims, 2 Drawing Sheets

METHOD OF FABRICATING FLASH MEMORY DEVICE

BACKGROUND

1. Field of the Invention

The present invention relates to a method of fabricating a flash memory device, and more specifically, to a method of fabricating a flash memory device, wherein a thickness and width of bit lines can be formed uniformly.

2. Discussion of Related Art

In a flash memory device, bit lines are formed in such a manner that an oxide film is deposited on a semiconductor substrate in which predetermined underlying patterns such as a gate, a source contact and a drain contact are formed, trenches are formed in the oxide film, the trenches are filled with a metal film, and chemical mechanical polishing (CMP) is performed on the metal film.

A thickness and width of the bit lines decide bit line resistance and capacitance values. It is thus possible to constantly maintain the bit line resistance and capacitance values by controlling a thickness and width of the oxide film.

The irregularity of a bit line width is incurred due to loss of an oxide film on the sides of trenches in a cleaning process that is performed before a metal film formation process after the trenches are formed. In order to prevent this, a wet barrier is formed on the sides of the trenches using a nitride film. Since the nitride film has a dielectric constant higher than that of the oxide film, however, there is a problem in that bit line capacitance increases due to the wet barrier.

Meanwhile, the irregularity in a thickness of a bit line is caused by loss of an oxide film in a trench etch process or a metal film CMP process. In order to prevent this, a CMP stop layer and an etch stop layer must be formed at the top and bottom of the oxide film, respectively.

A CMP stop layer and an etch stop layer are lost due to a wet chemical used in a cleaning process, which is performed before a metal film formation process after trenches are formed. Therefore, the irregularity problem of bit line thickness still remains unsolved.

The irregularity problem in a thickness and width of bit lines becomes more profound as a device shrinks, and causes the irregularity of bit line resistance and capacitance, which leads to degraded device characteristics.

SUMMARY OF THE INVENTION

Accordingly, the present invention has been made in view of the above problems, and it is an object of the present invention to provide a method of fabricating a flash memory device, wherein a thickness and width of bit lines can be made uniform.

Another object of the present invention is to improve the regularity of resistance and capacitance of bit lines.

Further another object of the present invention is to reduce bit line capacitance.

To accomplish the above objects, according to an aspect of the present invention, there is provided a method of fabricating a flash memory device, including the steps of (a) forming a first SiON film on a semiconductor substrate and thermally treating the first SiON film, (b) forming an insulating film on the thermally treated first SiON film, (c) forming a second SiON film on the insulating film and thermally treating the second SiON film, (d) patterning the thermally treated second SiON film, the insulating film and the thermally treated first SiON film to form trenches, (e) forming a third SiON film on the entire surface, thermally treating the third SiON film, and allowing the thermally treated third SiON film to remain on the sides of the trenches, and (f) forming bit lines within the trenches.

The first SiON film is preferably formed to a thickness of 150 to 300 Å.

A thermal treatment temperature of the step (a), (c) and (e) is preferably 500 to 850° C.

The thermal treatment process of the step (a), (c) and (e) is preferably performed under an oxidization atmosphere and inert atmosphere.

The second SiON film is preferably formed to a thickness of 200 to 500 Å.

The third SiON film is preferably formed to a thickness of 30 to 100 Å.

The step (d) can include the steps of forming a hard mask film on the thermally treated second SiON film, patterning the hard mask film and the thermally treated second SiON film by means of a photolithography process, patterning the insulating film and the thermally treated first SiON film using the patterned hard mask film as a mask, forming trenches, and removing the hard mask film.

The hard mask film is preferably formed using a silicon nitride film.

When removing the hard mask film, phosphoric acid ($H_3PO_4$) is used.

DETAILED DESCRIPTION OF PREFERRED EMBODIMENTS

Figure 1A:
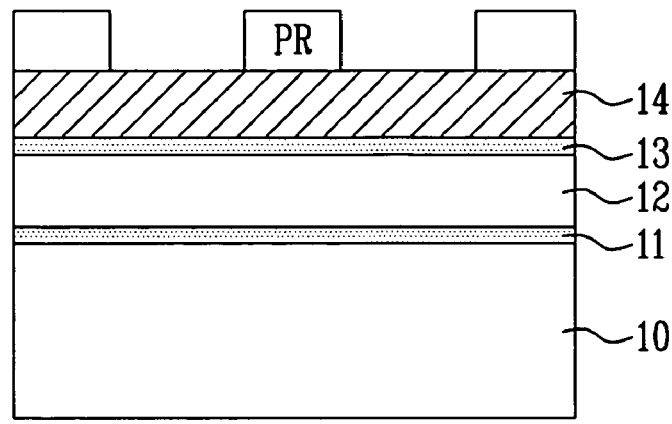
FIGS. 1*a* to 1*f* are cross-sectional views for explaining a method of fabricating a flash memory device according to a preferred embodiment of the present invention.

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Table 1 shows the results of measuring variations in a thickness and the etch rate (Å/min) depending upon a wet cleaning process of a SiON film on which thermal treatment is not performed.

TABLE 1

| | | Wafer State | | | | | |
|---|---|---|---|---|---|---|---|
| | | SiON thickness after coating | | | SiON thickness after trench etch | | |
| | | Wafer | | | | | |
| | | #1 | #2 | #3 | #4 | #5 | #6 |
| | | Wet chemical (process time) | | | | | |
| | | 99HF (5 second) | 300BOE (5 second) | $H_3PO_4$ (5 second) | 99HF (5 second) | 300BOE (5 second) | $H_3PO_4$ (5 second) |
| Thickness (Å) before wet cleaning process | Min | 1385.1 | 1481.6 | 1435.2 | 1025.8 | 1185.5 | 1151.1 |
| | Max | 1441.7 | 1568.6 | 1533.2 | 1109.7 | 1299.2 | 1227.3 |
| | Avg | 1411.3 | 1521.3 | 1480.6 | 1051.4 | 1215.8 | 1172.5 |
| Thickness (Å) after wet cleaning process | Min | 1156.2 | 1228.6 | 1204.7 | 777.9 | 874.0 | 877.6 |
| | Max | 1262.5 | 1346.3 | 1305.7 | 890.5 | 997.6 | 961.5 |
| | Avg | 1211.8 | 1286.8 | 1258.3 | 817.5 | 911.5 | 909.5 |
| Loss thickness (Å) | Min | 181.1 | 212.9 | 167.9 | 215.6 | 294.5 | 191.2 |
| | Max | 233.7 | 268.7 | 193.7 | 267.4 | 330.6 | 227.1 |
| | Avg | 199.5 | 234.5 | 182.5 | 233.9 | 304.3 | 216.2 |
| Etch rate (Å/min) | | 39.9 | 46.9 | 36.5 | 46.8 | 60.9 | 43.2 |

From Table 1, it can be seen that a SiON film on which thermal treatment is not performed has a very high etch rate of 46.5 to 60.9 Å/min by a wet cleaning process.

The following Table 2 shows the results of measuring the etch rate (Å/min) depending upon a wet cleaning process of a SiON film on which thermal treatment is performed, which is applied to the present invention.

TABLE 2

| Etch Thickness (Å) of Thermally Treated SiON | | | |
|---|---|---|---|
| Wet Chemical | HF | BOE | $H_3PO_4$ |
| #1 | 28.39 | 50.19 | 14.92 |
| #2 | 26.88 | 49.44 | 17.07 |
| #3 | 28.08 | 50.98 | 19.42 |
| #4 | 28.56 | 48.50 | 19.92 |
| #5 | 29.02 | 49.74 | 20.24 |
| #6 | 27.99 | 58.73 | 20.36 |
| #7 | 26.24 | 45.54 | 19.91 |
| #8 | 26.83 | 47.36 | 19.30 |
| #9 | 30.23 | 48.25 | 22.74 |
| Min | 26.24 | 45.54 | 14.92 |
| Max | 30.23 | 58.73 | 22.74 |
| Avg | 28.02 | 49.86 | 19.32 |
| Range | 3.99 | 13.19 | 60.31 |
| Etch Rate (Å/min) | 2.80 | 4.99 | 1.93 |

From Table 2, it can be seen that a SiON film on which thermal treatment is performed has a low etch rate of 5 Å/min or less due to a wet chemical unlike a SiON film on which thermal treatment is not performed.

In view of the above, in the present invention, an oxide film is deposited and etched to form trenches, the trenches are filled with a metal film, and the metal film undergoes CMP to form bit lines. In this case, an etch stop layer of the trench etch process, a CMP stop layer of a CMP process and a wet barrier on the sides of the trenches are formed using a SiON film that is thermally treated. Thereby, a thickness and width of bit lines become uniform by preventing loss of the oxide film in a wet cleaning process.

FIGS. 1a to 1f are cross-sectional views for explaining a method of fabricating a flash memory device according to a preferred embodiment of the present invention.

Referring to FIG. 1a, a first SiON film 11, which serves as a wet barrier and an etch stopper, is formed to a thickness of 150 to 300 Å on a semiconductor substrate 10 in which predetermined underlying patterns such as a gate, a source contact and a drain contact are formed. The first SiON film 11 undergoes thermal treatment.

At this time, the thermal treatment process on the first SiON film 11 can be performed under an oxidization atmosphere and inert atmosphere having a temperature of 500 to 850° C.

An insulating film such as an oxide film 12 is then formed on the first SiON film 11 that is thermally treated. A second SiON film 13 serving as a wet barrier and a CMP stopper is formed to a thickness of 200 to 500 Å and is then thermally treated.

At this time, the thermal treatment process on the second SiON film 13 can be performed under an oxidization atmosphere and inert atmosphere having a temperature of 500 to 850° C.

A hard mask 14 is then formed on the second SiON film 13 that is thermally treated. The hard mask 14 can be formed using a nitride film such as a silicon nitride (SiN) film.

Thereafter, a photoresist PR is coated on the hard mask 14, and the photoresist PR is patterned by means of an exposure and development process, thereby forming bit lines.

Figure 1B:
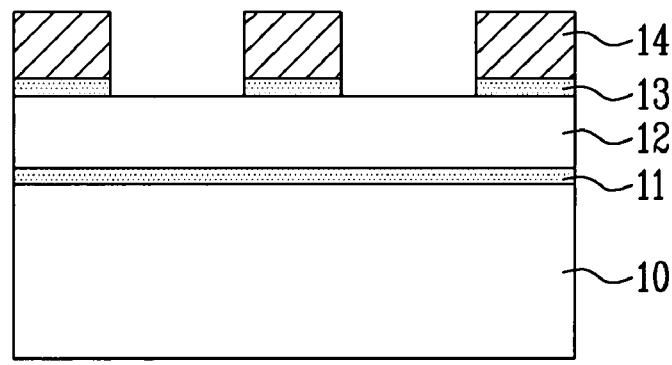

Referring next to FIG. 1b, the hard mask film 14 and the thermally treated second SiON film 13 are etched using the patterned photoresist PR as a mask.

At this time, upon etching of the hard mask film 14, a width of the hard mask film 14 is controlled by adjusting etch conditions, and a width of trenches to be formed later is thus controlled.

Figure 1C:
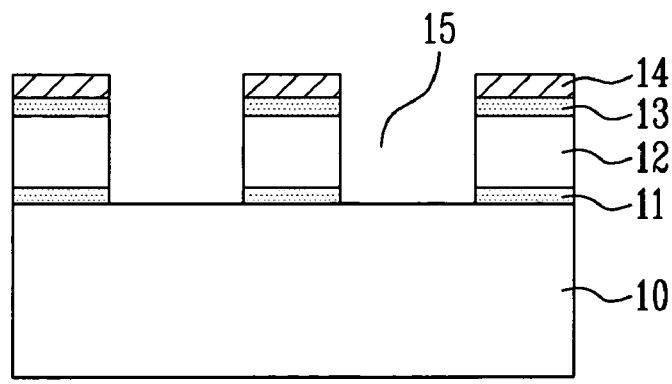

After the photoresist PR is removed, the oxide film 12 and the thermally treated first SiON film 11 are sequentially etched using the hard mask film 14 as a mask, forming trenches 15, as shown in FIG. 1c.

At this time, the oxide film 12 is etched using the thermally treated first SiON film 11 as an etch stop film, and the thermally treated first SiON film 11 is then etched after changing etch conditions. When the thermally treated first SiON film 11 is etched, a bottom layer of the thermally treated first SiON film 11 is lost to a thickness of 100 to 1000 Å.

Upon etching of the trenches 15, the hard mask film 14 is also etched, so that a thickness of the hard mask film 14 becomes shallows, as shown in FIG. 1c.

Figure 1D:
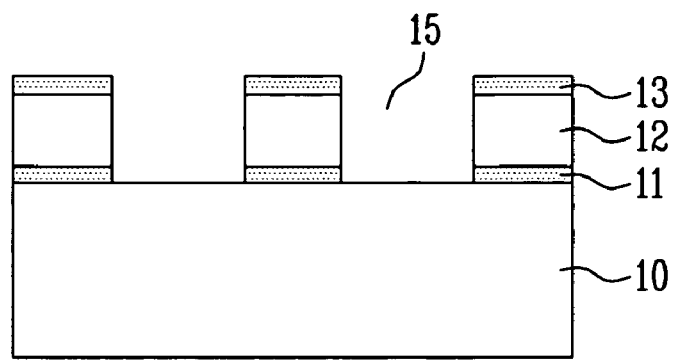

Referring to FIG. 1d, the remaining hard mask film 14 is completely removed in a phosphoric acid ($H_3PO_4$) bath of a high temperature. When the hard mask film 14 is removed, a lost thickness of the oxide film 12 on the sides of the trenches 15 is set to 50 Å or less, and a lost thickness of the thermally treated first and second SiON films 11 and 13 is set to 50 Å or less.

Figure 1E:
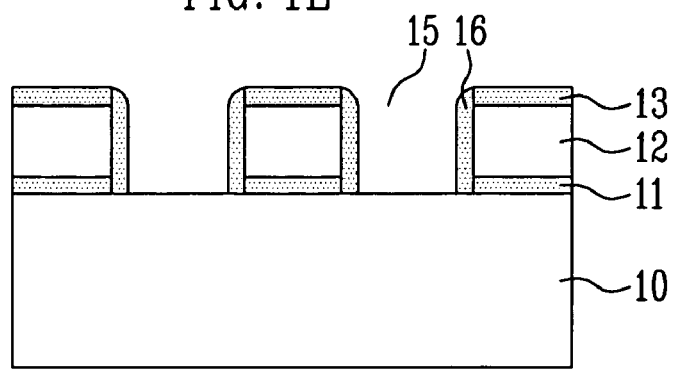

Referring to FIG. 1e, in order to prevent loss of the oxide film 12 on the sides of the trenches 15, which is caused by a wet chemical used in a subsequent wet cleaning process, a SiON film having a dielectric constant lower than that of a nitride film, which is used in an existing wet barrier, is formed to a thickness of 30 to 100 Å on the entire surface including the trenches 15, forming a third SiON film. The third SiON film is then thermally treated.

The thermally treated third SiON film is etched back so that it remains only on the sides of the trenches 15, thus forming wet barriers 16.

Figure 1F:
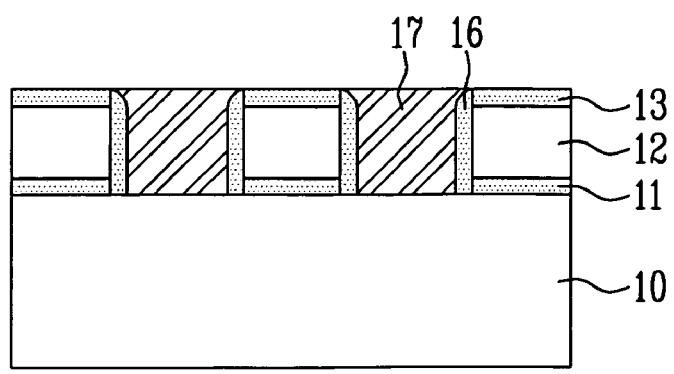

Referring next to FIG. 1f, a metal film is deposited on the entire surface so that the trenches 15 are completely buried. The entire surface undergoes CMP using the thermally treated second SiON film 13 as a stopper layer, thus forming bit lines 17 within the trenches 15.

Thereby, fabrication of a flash memory device according to an embodiment of the present invention is completed.

As described above, the present invention has the following effects.

First, loss of an oxide film due to a wet chemical can be prevented using a thermally treated SiON film. It is possible to make uniform a thickness and width of bit lines. Accordingly, there is an effect in that resistance and capacitance of bit lines can be maintained constantly.

Next, a wet barrier is formed using a SiON film having a dielectric constant lower than that of a nitride film, thus lowering capacitance of bit lines. It is thus possible to improve the speed of bit lines.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of fabricating a flash memory device, comprising the steps of:
   (a) forming a first SiON film on a semiconductor substrate and thermally treating the first SiON film;
   (b) forming an insulating film on the thermally treated first SiON film;
   (c) forming a second SiON film on the insulating film and thermally treating the second SiON film;
   (d) patterning the thermally treated second SiON film, the insulating film and the thermally treated first SiON film to form trenches;
   (e) forming a third SiON film on the entire surface, thermally treating the third SiON film, and allowing the thermally treated third SiON film to remain on the sides of the trenches; and
   (f) forming bit lines within the trenches.

2. The method as claimed in claim 1, wherein the first SiON film is formed to a thickness from 150 Å to 300 Å.

3. The method as claimed in claim 1, wherein a thermal treatment temperature of the step (a), (c) and (e) is from 500° to 850° C.

4. The method as claimed in claim 1, wherein the thermal treatment process of the step (a), (c) and (e) is performed under an oxidization atmosphere and inert atmosphere.

5. The method as claimed in claim 1, wherein the second SiON film is formed to a thickness from 200 Å to 500 Å.

6. The method as claimed in claim 1, wherein the third SiON film is formed to a thickness from 30 Å to 100 Å.

7. The method as claimed in claim 1, wherein the step (d) includes the steps of:
   forming a hard mask film on the thermally treated second SiON film;
   patterning the hard mask film and the thermally treated second SiON film by means of a photolithography process;
   patterning the insulating film and the thermally treated first SiON film using the patterned hard mask film as a mask, forming trenches; and
   removing the hard mask film.

8. The method as claimed in claim 7, wherein the hard mask film is formed using a silicon nitride film.

9. The method as claimed in claim 7, wherein when removing the hard mask film is performed using a phosphoric acid ($H_3PO_4$).

* * * * *